United States Patent [19]
Pitzer et al.

[11] Patent Number: 5,923,979
[45] Date of Patent: Jul. 13, 1999

[54] PLANAR DMOS TRANSISTOR FABRICATED BY A THREE MASK PROCESS

[75] Inventors: Dorman C. Pitzer, San Ramon; Mike F. Chang; Hong Wang, both of Cupertino, all of Calif.

[73] Assignee: Siliconix Incorporated, Santa Clara, Calif.

[21] Appl. No.: 08/922,672

[22] Filed: Sep. 3, 1997

[51] Int. Cl.$^6$ ................................................. H01L 21/336
[52] U.S. Cl. ........................................................ 438/268
[58] Field of Search ................................. 438/268, 239, 438/210, 240, 253, 256, 396, 399

[56] References Cited

U.S. PATENT DOCUMENTS

| | | | |
|---|---|---|---|
| 4,078,947 | 3/1978 | Johnson et al. | 148/1.5 |
| 4,376,286 | 3/1983 | Lidow et al. | 357/23 |
| 4,593,302 | 6/1986 | Lidow et al. | 357/23 |
| 4,642,666 | 2/1987 | Lidow et al. | 357/23.4 |
| 4,680,853 | 7/1987 | Lidow et al. | 29/571 |
| 4,705,759 | 11/1987 | Lidow et al. | 437/29 |
| 4,803,532 | 2/1989 | Mihara | 357/234 |
| 4,941,026 | 7/1990 | Temple | 357/23.4 |
| 4,959,699 | 9/1990 | Lidow et al. | 357/23.7 |
| 5,008,725 | 4/1991 | Lidow et al. | 357/23.4 |
| 5,016,066 | 5/1991 | Takahashi | 357/23.4 |
| 5,072,266 | 12/1991 | Bulucea et al. | 357/23.4 |
| 5,138,422 | 8/1992 | Fujii et al. | 357/49 |
| 5,168,331 | 12/1992 | Yilmaz | 257/331 |
| 5,393,999 | 2/1995 | Malhi | 257/289 |
| 5,397,717 | 3/1995 | Davis et al. | 437/40 |
| 5,442,219 | 8/1995 | Kato | 257/370 |
| 5,451,797 | 9/1995 | Davis et al. | 257/77 |
| 5,585,658 | 12/1996 | Mukai et al. | 257/344 |
| 5,710,073 | 1/1998 | Jeng et al. | 438/239 |

FOREIGN PATENT DOCUMENTS

| | | |
|---|---|---|
| 0 335 750 | 10/1989 | European Pat. Off. . |
| 0 345 380 | 12/1989 | European Pat. Off. . |
| 55-67161 | 5/1980 | Japan . |
| 55-146976 | 11/1980 | Japan . |
| 56-58267 | 5/1981 | Japan . |
| 57-153469 | 9/1982 | Japan . |
| 57-188877 | 11/1982 | Japan . |
| 59-84474 | 5/1984 | Japan . |
| 62-176168 | 1/1987 | Japan . |
| 1-42177 | 2/1989 | Japan . |
| WO96/31908 | 10/1996 | WIPO . |

OTHER PUBLICATIONS

Stanley Wolf et al., "Silicon Processing for the VLSI Era—vol. 1: Process Technology", Lattice Press, 1986, pp. 124–160.

Stanley Wolf, "Silicon Processing for the VLSI Era—vol. 2: Process Integration", Lattice Press, 1990, pp. 674–675.

Y. Morita et al., "Si UHF MOS High–Power FET", IEEE Transactions on Electron Devices, Nov. 1974, pp. 733–734.

Yoshida et al., "A High Power MOSFET with a Vertical Drain Electrode and a Meshed Gate Structure", IEEE Journal of Solid–State Circuits, vol. SC–11, No. 4, Aug. 1976, pp. 472–477.

Syau et al., "Comparison of Ultralow Specific On–Resistance UMOSFET Structures: The ACCUFET, EXTFET, INVFET, and Conventional UMOSFET's", IEEE Transactions on Electron Devices, vol. 41, No. 5, May 1994, pp. 800–808.

*Primary Examiner*—Tuan H. Nguyen
*Assistant Examiner*—Craig Thompson
*Attorney, Agent, or Firm*—Skjerven, Morrill, MacPherson, Franklin & Friel, LLP; Norman R. Klivans

[57] ABSTRACT

A planar DMOS power transistor (MOSFET) fabricated using only three masking steps, resulting in a significant reduction in fabrication cost. The resulting device is in terms of operations similar to prior art devices formed using more masking steps. Both the source and body regions are formed by implantations through the identical openings in the polysilicon/gate oxide layers into the substrate. After a subsequent glass layer is deposited and masked to expose openings, body contact regions are implanted into the source regions by overdosing the source region dopant concentration. The third masking step is the metal mask which also forms a termination structure.

8 Claims, 3 Drawing Sheets

PLANAR DMOS TRANSISTOR FABRICATED BY A THREE MASK PROCESS

FIELD OF THE INVENTION

This invention relates to transistors and more specifically to fabrication of a planar DMOS field effect transistor.

BACKGROUND

Power (high voltage) field effect transistors are well known. One such transistor is called a DMOS (double diffused metal oxide semiconductor) transistor; for instance see published international application PCT/US96/04175, "Lateral Field Effect Transistor Having Reduced Drain to Source on-Resistance", Hshieh, et al., applicant Silicon Incorporated, incorporated herein by reference in its entirety.

Such transistors (also referred to as MOSFETs) are typically formed on a die which is a portion of a silicon substrate. The actual fabrication involves multiple steps of depositing and etching various materials. The etching steps typically (not always) etch features in one of the layers of material as defined by a masking layer which is a layer of material impervious to the etching material and which defines underlying features as a result of photolithography to pattern the masking layer. Much of the complication of semiconductor fabrication involves the masking steps in terms of alignment (registration of various successive masking steps) and the attendant complexity of fabricating and using the reticles (masks) themselves. Hence, it is a well known goal to minimize the number of masking steps.

In the prior art it is known to fabricate a field effect transistor using as few as 4 masking steps, each with its associated mask. While a 4 mask process is a significant improvement over previous 7 or 9 mask processes, etc. still it would be desirable to further reduce the number of masking steps to further reduce manufacturing costs.

SUMMARY

In accordance with this invention, a planar (non-trenched) field effect transistor is formed using a total of only three masking steps. The third and last masking step is the conventional metal mask step which is somewhat similar here to the corresponding step in the prior art. However, the first two masking steps are such that the first masking step defines openings in the overlying gate oxide and polysilicon layer, through which openings the body regions and source regions are implanted and subsequently diffused into the substrate. In a subsequent step a layer of glass, e.g. BPSG, is deposited over the surface of the substrate and over the openings. A second masking step defines openings in this BPSG layer which correspond to the earlier formed openings defining the source/body regions. Through these new openings, which are somewhat narrower than the original openings, the body contact regions are implanted into the central portions of the source regions. Thus a mere two masking steps allows implantation of all of the source, body and body contact regions in the substrate.

Also in accordance with this invention, a particular termination structure is provided which is formed using the contact masking step and the metal masking step, thereby avoiding any additional termination masks.

The resulting semiconductor device is similar in terms of performance to prior art planar power MOSFETs. Thus in accordance with the invention an ohmic electrical contact to the body region is accomplished by effectively overdoping the source region concentration through the contact opening, which is etched down to the silicon through the glass layer. Contact to the source region is then accomplished by wet etching and widening the contact region opening. For the termination, the active polysilicon layer (gate layer) is separated from the polysilicon in the termination region by making an opening during the contact masking step down to the polysilicon layer and removing a portion of the polysilicon in the termination area during the metal masking step.

DETAILED DESCRIPTION

The following description is of a transistor and associated fabrication process in accordance with this invention. It is to be understood that the illustrations are a partial cross section of several transistor cells; usually an actual device would include a very large number of identical transistor cells, although a single cell transistor in accordance with this invention is also contemplated. The following drawings are not to scale and also are conventional cross sectional drawings; it is to be understood that in the actual device the regions herein depicted as being doped regions are distinguished by their relative doping concentrations. In general the materials and dimensions of the various structures shown herein are conventional except wherein as noted otherwise. Also, while one embodiment of a fabrication process and transistor are disclosed resulting in an N channel device, the various doping types may be reversed in order to fabricate a P channel device, as is readily understood by one of ordinary skill in the art.

Figure 1:
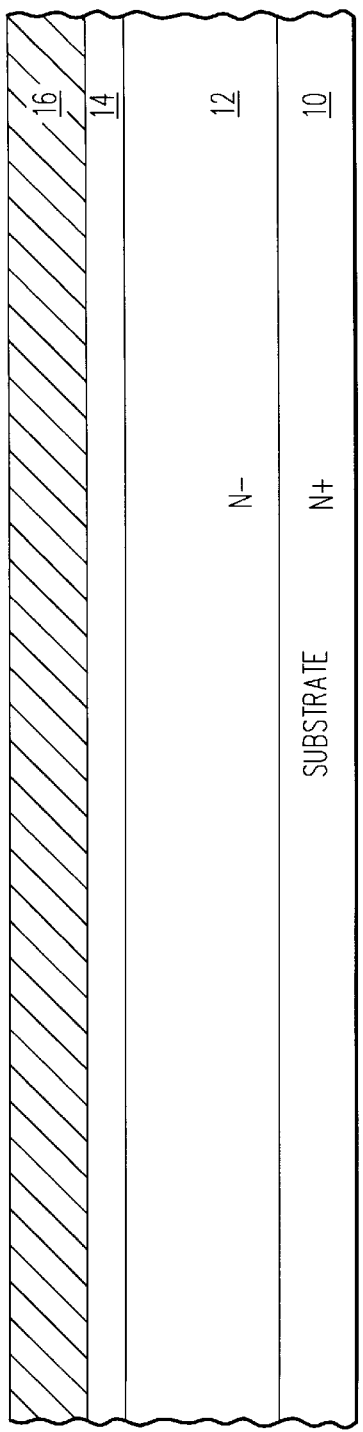
FIGS. 1–5 show in cross section a series of steps for forming a transistor in accordance with this invention; a cross section of the completed transistor is shown in FIG. 5.

FIG. 1 shows the first few steps to fabricate a transistor in accordance with this invention. The substrate 10 is typically N+ doped to have a resistivity of e.g. 1 to 5 m$\Omega$-cm. Grown on the N+ substrate 10 is an N– doped epitaxial layer 12 having a thickness of 2.0 to 10.0 (not limiting) micrometers and a resistivity of 100 to 2000 m$\Omega$-cm (not limiting). FIG. 1 is not to scale and typically the substrate 10 is much thicker than the epitaxial layer 12. Moreover, FIG. 1 portrays only a small portion in cross section of a substrate. Conventionally grown on the upper surface of the epitaxial layer 12 is a gate oxide layer 14 which is silicon dioxide having a thickness of e.g. 100 to 500 angstroms (not limiting). The gate oxide thickness depends on the impressed gate voltage, as is conventional. Formed overlying the gate oxide layer 14 is a polycrystalline silicon (polysilicon) layer 16 typically 0.3 to 1.0 micrometers thick. Polysilicon layer 16 is then conventionally doped. The polysilicon layer 16 is heavily doped so as to be effectively a conductor. For an N channel device, phosphorous is a typical dopant. For a P channel device, the polysilicon layer is doped during the source implant step.

Figure 2:
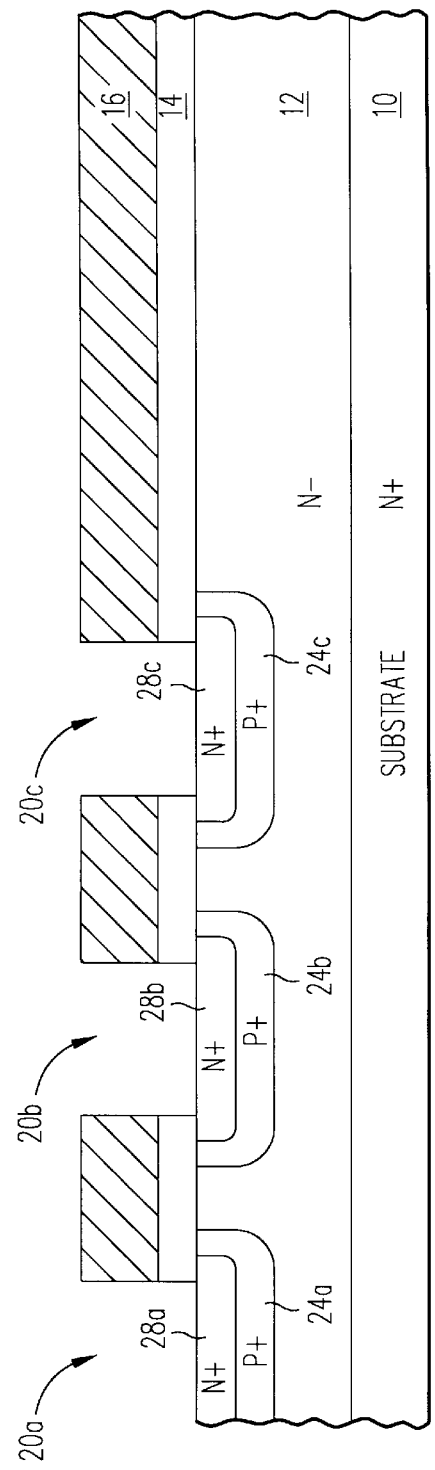

Referring to FIG. 2, a photoresist masking layer is formed over the upper surface of polysilicon layer 16 and is patterned. Then etching is performed on polysilicon layer 16 and gate oxide layer 14, thus defining openings 20a, 20b, and 20c. This first masking step is referred to as the "poly mask".

Next, the P– doped body regions 24a, 24b and 24c are formed by ion implanting a P type dopant, e.g. boron, at a typical energy level of 30 keV to 60 keV and a dose of for instance $5 \times 10^{13}$ to $1.5 \times 10^{14}$/cm$^2$. These energy and dosage levels are not limiting. After a subsequent diffusion step the depth of the P– body regions 24a, etc. is about 1.5 micrometers (not limiting), extending down from the principal surface of epitaxial layer 12.

Next, the N+ doped source regions 28a, 28b and 28c are formed. The source regions are implanted using e.g. arsenic at a typical energy level of 80 keV and a dosage of $8 \times 10^{15}/cm^2$ to form a junction depth, after a subsequent diffusion step, of 0.5 micrometers. The illustrated P– body region, the N+ source region, and the N– epitaxial layer results in an N channel device.

Hence the poly mask masking step defines the openings 20a, etc. used to implant both the body regions and the source regions. It is to be understood that the reference to "regions" here refers to regions which appear in the cross section of e.g. FIG. 2 to be discrete but in fact may be portions of a single source or body or other region which is connected outside the plane of the drawing.

Figure 3:
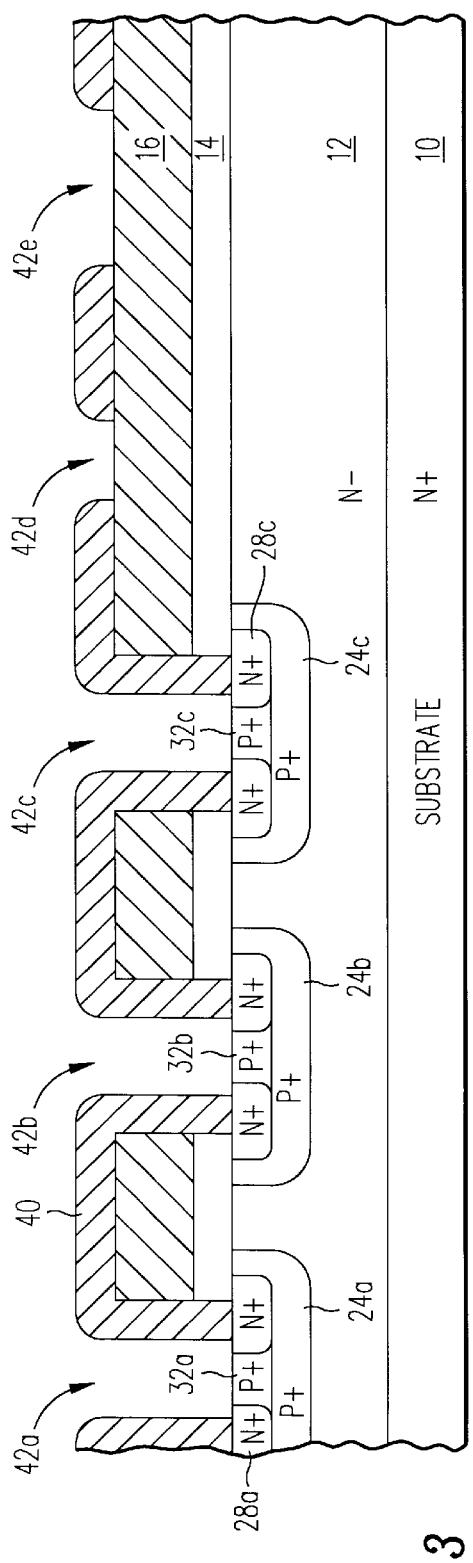

Next, referring to FIG. 3, first a layer of borophosphosilicate glass (BPSG) 40 is formed over the entire structure of FIG. 2 covering the sides of the polysilicon/gate oxide structures as well as covering the exposed portions of the surface of the epitaxial layer 12. BPSG layer 40 is deposited to a thickness of e.g. 7,500 angstroms and then is planarized by a flow step involving sufficient elevated temperature and time to planarize the BPSG layer 40 surface.

Next is the second masking step referred to as the "contact mask". with reference again to FIG. 3, a mask layer (not shown) is deposited and patterned by photolithography in order to define openings therein 42a, 42b, 42c, 42d and 42e. The subsequent etching again exposes portions of the upper surface of the epitaxial layer 12 as well as portions of the polysilicon layer 16, at the right-hand side of the drawing. (It is to be understood that the right-hand side of the drawings is a termination portion of the transistor and the left-hand portion is the active portion).

After this contact masking step, the P+ body contact regions 32a, 32b and 32c are formed by ion implantation of e.g. boron. The energy level is similar to that of the body region implantation. However, the body contact region dose is about 10 times higher than the dose used to implant the P– body regions. The reason for this high dosage is that it is necessary to counterdope the surrounding N+ source regions in order to define the P+ body contact regions 32a etc. This process is referred to as "overdoping" the source region concentration in the body region contact areas.

After implantation of the P+ body contact regions 32a, etc. a reflow step reflows the BPSG layer 40. This reflow step also diffuses the P+ regions 32a, etc. and activates the implanted P+ dopant. The reflow step (heating) results in growth of a certain amount of silicon oxide in the openings 42a, 42b, 42c on the exposed parts of epitaxial layer 12; this oxide, which is not desirable, is then removed by a subsequent wet unmasked oxide etch step, resulting in the structure shown in FIG. 3.

Figure 4:
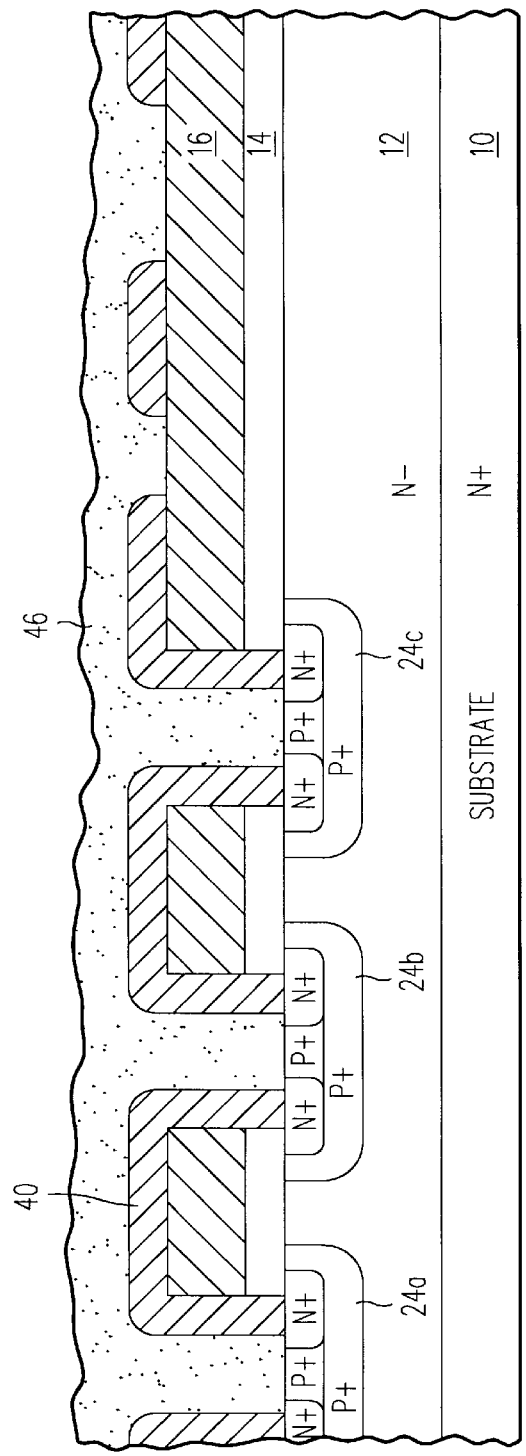

Next as shown in FIG. 4 a conventional metal layer 46, e.g. an alloy of aluminum, silicon and copper, is sputtered over the entire upper surface of the structure of FIG. 4. As shown, metal layer 46 contacts at the openings 42a, 42b, 42c both the source regions 28a etc. and the body contact regions 32a etc. thus forming a source/body contact.

Figure 5:
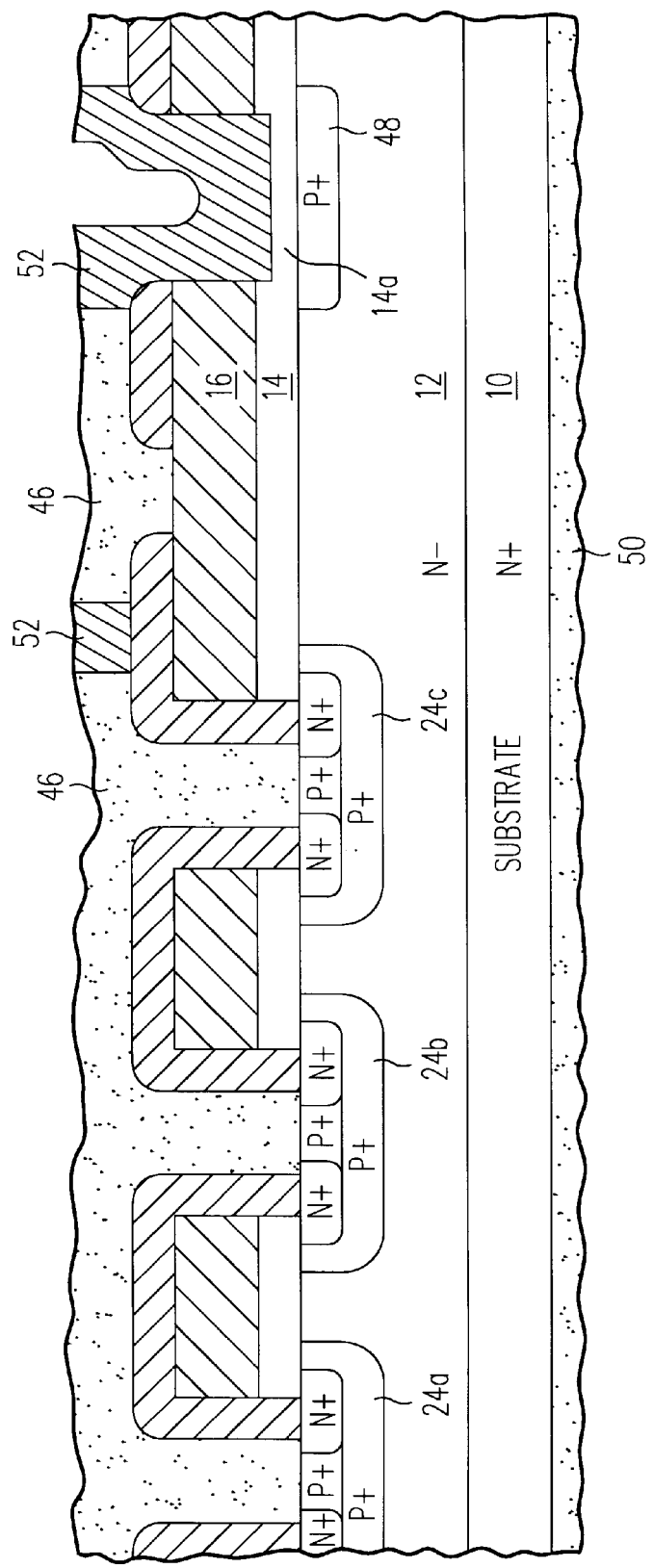

Next with reference to FIG. 5, the third masking step takes place which is the mostly conventional metal masking step to define the lateral extent of this metallization layer 46. In general the metallization is patterned only outside the plane of FIG. 5, with the exception of area 52 shown in FIG. 5, where the metal masking layer defines an opening over metal layer 46. Subsequent etching using this metal masking layer creates the opening 52 in the right hand portion of FIG. 5 extending from the top of the metal layer 46 down to the gate oxide layer 14. This is a two step etching (metal etch followed by silicon etch) that etches away a portion of the gate oxide layer 14 leaving the portion indicated at 14a. Next, using this opening 52 an implantation step is carried out. The metal layer 46 of course shields the rest of the device from this implantation which thereby defines a doped termination region 48 which is shown in this case as P– doped but may be e.g. N– doped.

Next, as shown in FIG. 5 a PSG (phosphosilicate glass) layer is deposited over the entire structure, filling the opening 52. This PSG layer is then etched back, using a maskless dry etch, so that the PSG only remains in the opening 52, resulting in the structure shown in FIG. 5.

A subsequent step conventionally alloys the metal layer 46.

The remaining steps involve forming a conventional metallized drain electrode 50 on the lower surface of the substrate 10. The device is then conventionally completed by scribing the substrate into die and packaging the die. Hence the structures 52 and 48 shown in FIG. 5 are part of the die termination and not the active portion of the transistor. As shown, the metal layer 46 contacts a portion of the polysilicon 16 in the termination region but this is not necessary for device operation. The termination doped region 48 electrically field profiles the termination in order to improve high voltage breakdown performance of the resulting transistor. This illustrated termination is not limiting and need not be used in accordance with the invention.

One problem encountered in accordance with this structure is the step of overdoping the source regions in order to form the P+ body contact regions. Especially in the context of a P channel device (not shown) one must use a relatively low temperature to diffuse the N+ body contact regions, to avoid excess lateral diffusion of the earlier implanted source regions. Hence the actual doping level in terms of dosage and energy of the body contact regions is rather critical and is subject to experimentation dependent on the doping levels of the source and body regions and the particular doping materials used. This is less critical in the context of an N channel device, as depicted, because there is less of a differential lateral diffusion problem with N doped source regions.

Other useful termination structures, not shown, include a field plate which can be formed without additional masking which can be used in combination with the above-described termination. The field plate is a well known structure overlying the substrate for termination purposes. Of course it is desirable to avoid any additional masking steps for the termination since that would reduce the economy of the present three mask process.

The structures described herein are not topology limited, in terms of the topside layout of the transistor, and hence are compatible with the various well known types of transistor cells, e.g. open cells, closed cells, and various cell configurations including stripes, hexagons, squares, etc. Advantageously with certain cell types, the actual dimension of the body contact regions is not limiting because, for instance in a stripe-type cell one may electrically contact the body contact region only at the ends of the stripes where such contact is relatively easy. The present device and method are also compatible with other well known improvements to MOSFET technologies such as various known improved cell density structures.

The present disclosure is illustrative and not limiting; further modifications will be apparent to one skilled in the light of this disclosure and are intended to fall within the scope of the appended claims.

We claim:

1. A method of forming a transistor in a substrate, comprising the steps of:

forming a dielectric layer on a principal surface of the substrate;

forming a polysilicon layer over the dielectric layer;

doping the polysilicon layer;

masking an upper surface of the polysilicon layer to define openings therein;

etching the openings through the polysilicon;

implanting a first conductivity type dopant into the openings to form body regions in the substrate;

implanting a second opposite conductivity type dopant through the openings to form a source regions in the substrate;

depositing a glass layer over the substrate and on the openings;

masking and etching the glass layer to define openings therein and to expose at least portions of the source regions at the principal surface of the substrate;

implanting a dopant of the first conductivity type into the exposed portions of the source regions, to form body contact regions in the source regions and extending through the source regions to the body regions;

depositing a metal layer over the glass layer; and masking the metal layer and etching openings therein.

2. The method of claim 1, wherein the step of masking the metal layer includes defining an opening in the metal layer at a termination portion of the transistor and etching away the metal layer dowen to the principal surface of the substrate in the opening in the metal layer, and further comprising the steps of:

depositing a dielectric material in the opening of the metal layer and over the metal layer; and etching away the deposited dielectric material except in the opening in the metal layer.

3. The method of claim 2, further comprising the step of implanting a dopant in the substrate through the opening in the metal layer, prior to the step of depositing a dielectric material.

4. The method of claim 2, wherein the deposited dielectric material is PSG.

5. The method of claim 1, wherein the body contact regions are implanted at a dose at least ten time higher than a dose for implanting the body regions or $1 \times 10^{15}$ higher than the source regions.

6. The method of claim 1, wherein the body contact regions are implanted at a dose of at least $1 \times 10^{15}/cm^2$ higher than that of the source regions.

7. The method of claim 1, wherein the transistor is formed using no more than three masking steps.

8. The method of claim 1, further comprising the steps of:

flowing the glass layer after the step of implanting the body contact regions; and etching away without a mask the flowed glass layer and any associated oxide layer, to expose the principal surface of the substrate.

* * * * *

UNITED STATES PATENT AND TRADEMARK OFFICE
CERTIFICATE OF CORRECTION

PATENT NO.   : 5,923,979
DATED        : July 13, 1999
INVENTOR(S)  : Pitzer, Dorman C., Chang, Mike F. and Wang, Hong It is certified that error appears in the above-identified patent and that said Letters Patent is hereby corrected as shown below:

Column 6,
Line 2, delete "dowen" and insert -- down --.

Signed and Sealed this

Thirteenth Day of August, 2002

*Attest:*

*Attesting Officer*

JAMES E. ROGAN
*Director of the United States Patent and Trademark Office*